United States Patent [19]

Marquot et al.

[11] Patent Number: 4,827,451
[45] Date of Patent: May 2, 1989

[54] SAFETY DEVICE FOR THE PROGRAMMING OF AN ELECTRICALLY PROGRAMMABLE NON-VOLATILE MEMORY

[75] Inventors: Alexis Marquot, St Maximin; Serge Fruhauf, Peynier, both of France

[73] Assignee: Thomson Composants Militaires et Spatiaux, Paris, France

[21] Appl. No.: 102,527

[22] Filed: Sep. 29, 1987

[30] Foreign Application Priority Data

Sep. 30, 1986 [FR] France ............................. 86 13575

[51] Int. Cl.[4] .................. G11C 7/00; G11C 8/00; G06F 11/00
[52] U.S. Cl. ............................ 365/189.01; 365/228; 365/242; 371/10
[58] Field of Search ............... 365/189, 230, 228, 242, 365/185, 200, 190, 191, 195, 206, 207, 228; 371/14, 20, 21, 67, 10

[56] References Cited

U.S. PATENT DOCUMENTS

| | | | |
|---|---|---|---|
| 3,903,511 | 9/1975 | Lighthall | 365/242 |
| 4,211,919 | 7/1980 | Ugon | 237/487 |
| 4,295,041 | 10/1981 | Ugon | 234/487 |
| 4,467,457 | 12/1981 | Iwahashi et al. | 365/228 |
| 4,665,417 | 5/1987 | Lam | 365/185 |
| 4,719,598 | 1/1988 | Stockton | 365/242 |
| 4,744,062 | 5/1988 | Nakamura et al. | 365/228 |

FOREIGN PATENT DOCUMENTS 2311360 10/1976 France.

OTHER PUBLICATIONS

IBM Technical Disclosure Bulletin, vol. 25, No. 11A, Apr. 1983, pp. 5827-5828, NY, U.S., R. D. Burke, "Write Driver for a Random Access Memory".
Patent Abstracts of Japan, vol. 8, No. 60 (P-262) 1497), Mar. 22 1984, JP-A-58 208 991 (Nippon Kenki K.K.) 05-12-1983.
Electronique et Microelectronique Insutrielles, No. 215, Feb. 15, 1976, pp. 19-24, Paris, France, H. Lilen.

*Primary Examiner*—Terrell W. Fears
*Assistant Examiner*—Melissa J. Koval
*Attorney, Agent, or Firm*—Oblon, Fisher, Spivak, McClelland & Maier

[57] ABSTRACT

In a memory consisting of a matrix of memory cells, each of which is accessible by rows and columns and is connected to write and read circuits which are used, respectively, to programme them in two states, "1" or "0", depending on the input data, and to read the programmed state, the memory cells being of the type that require a programming current in order to be programmed in a first state or "1" and require no current to be programmed in a second state or "0", the safety device consists of a simulation circuit activated by data corresponding to a "0" programming operation and delivering a current identical to that of a memory cell in the "1" programming condition.

13 Claims, 2 Drawing Sheets

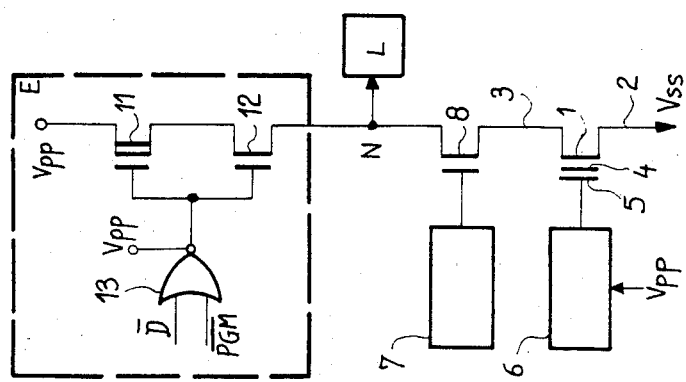
FIG_1 PRIOR ART
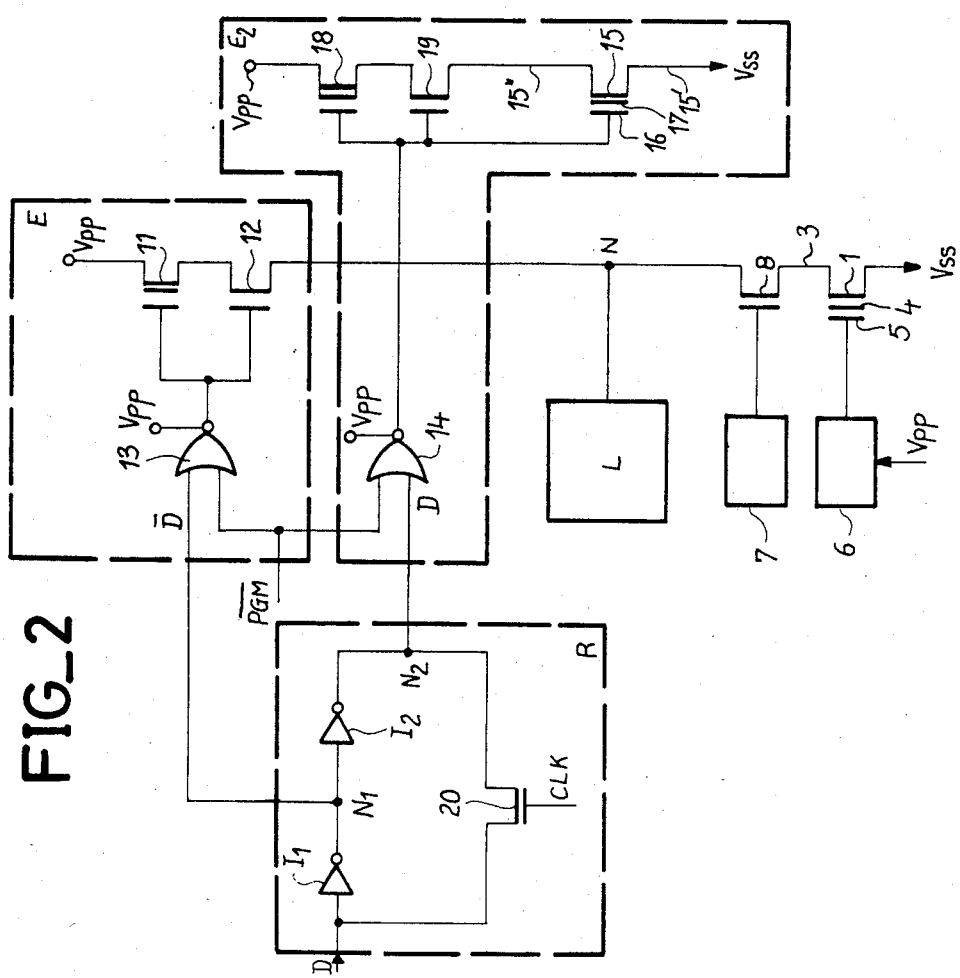
FIG_2

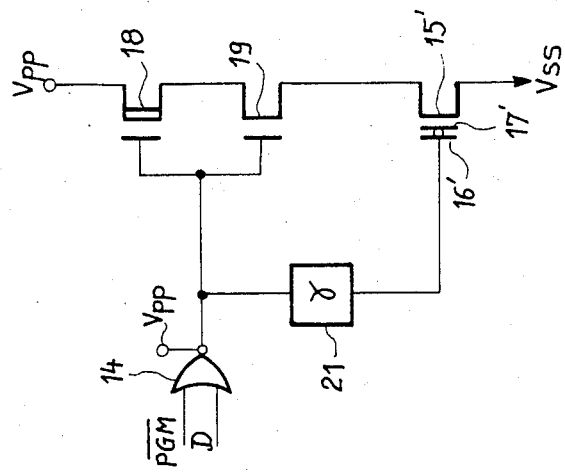
FIG._3
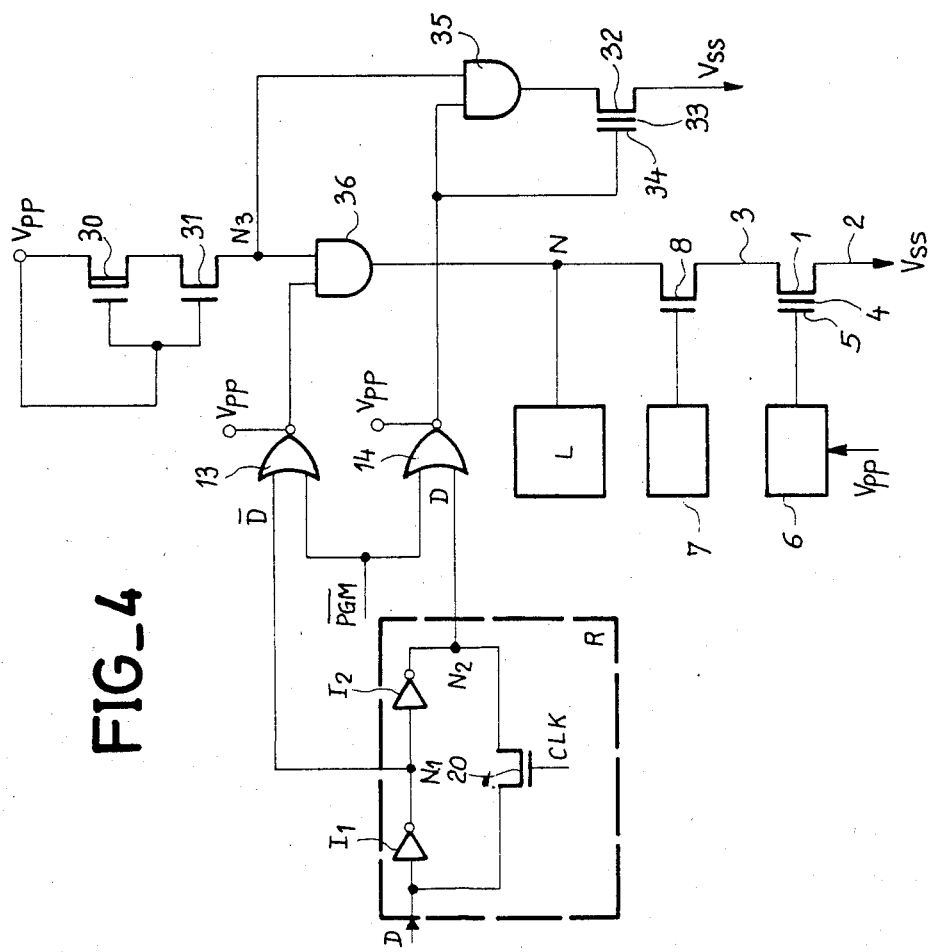
FIG._4

000
SAFETY DEVICE FOR THE PROGRAMMING OF AN ELECTRICALLY PROGRAMMABLE NON-VOLATILE MEMORY

BACKGROUND OF THE INVENTION

1. Field of the Invention

The present invention pertains to electrically programmable non-volatile memories that require a programming current, for example EPROM or EEPROM memories. They pertain more especially to a safety device for the programming of these memories.

2. Description of the Prior Art

Generally, in memories of the EPROM or EEPROM type, each data storage element or memory cell comprises a floating gate MOS transistor. A floating gate MOS transistor may have two states. For an N-channel MOS transistor, in a first state, no charge is trapped at the floating gate. There may be a conduction channel between the source and the drain. The transistor is then conductive and behaves like a closed switch. In a second state, the electrons have been trapped at the floating gate. They prevent the creation of a conduction channel in the substrate between the source and the drain. In this case, the transistor is off and behaves like an open switch.

To programme a floating-gate MOS transistor of the type described above, voltages higher than the normal operating voltage should be applied at the control gate and at one of the electrodes in such a way that the floating gate 5 can absorb and keep a charge of electrons. Furthermore, to read a memory thus programmed, a specific read voltage must be applied to the control gate. This read voltage is used to ascertain that the transistor is on or off.

To make it possible to apply the voltages needed for programming or reading a memory cell consisting of a floating-gate MOS transistor, the said transistor is generally connected in the manner shown in FIG. 1. Thus, one of the main electrodes of the floating-gate MOS transistor 1, namely the source 2 in the embodiment shown, is connected to the voltage $V_{SS}$, representing the earth, while the other electrode or drain 3 is connected by a bit line (not shown) and a MOS transistor forming a switch 8 to a column address decoder 7. The control gate 5 of the MOS transistor 1 is connected by means of another connection, known as a word line (not shown) to a row address decoder. The bit lines and word lines are arranged in rows and columns to determine a matrix including the memory cell formed by the floating-gate MOS transistor 1, in a way known to the specialist. In fact, the column address decoder 7 is connected to the gate of the transistor 8, which has its source connected to the drain 3 of the transistor 1, while its drain is connected to the write circuit E and to a read circuit, the latter being symbolized by the block L.

The write circuit E is made so that a voltage corresponding substantially to the write control voltage, namely the voltage $V_{pp}$, is applied at the node N when the memory cell 1 has to be programmed, i.e. when it has to record a datum, corresponding, for example, to a "1". On the contrary, if the memory cell 1 does not have to be programmed, the voltage at the node N during the writing operation is floating As shown in FIG. 1, the write circuit may be formed by a load comprising a depleted MOS transistor 11 which has one of its electrodes connected to the voltage $V_{pp}$ constituting the write control voltage, and its other electrode connected to one of the electrodes of an enhanced MOS transistor The other electrode of the transistor 12 is connected to the node N. The two gates of the transistors 11 and 12 are connected in common to a programming control circuit consisting of a NORgate 13 powered by the voltage $V_{pp}$. This NOR gate 13 receives respectively, at its two inputs, a signal $\overline{D}$ corresponding to the inverted datum to be programmed, and a signal $\overline{PGM}$ corresponding to the inverted programming signal Consequently, with the above circuit, a voltage substantially equal to the voltage $V_{pp}$ is obtained at the point N only if the signals $\overline{D}$ and $\overline{PGM}$ are both at zero, i.e. the write circuit is open if the datum D equals "1" and is off if the datum D equals "0" in the embodiment chosen as an example. In fact, current is consumed at the level of $V_{pp}$ only when the floating-gate MOS transistor 1 is programmed. Thus, by observing the variation of the write current in a memory, it is easy to ascertain whether a logic level "1" or a logic level "0" is programmed at a given address.

This is especially troublesome for memories used to receive confidential information, because it is then easy to detect the content of the said information when programming it.

An object of the present invention is to remove these disadvantages by proposing a safety device which prevents the detection of a "1" or "0" in an electrically programmable non-volatile memory requiring a programming current.

SUMMARY OF THE INVENTION

Thus, an object of the present invention is a safety device for the programming of an electrically programmable non-volatile memory, the said memory consisting of a matrix of memory cells, each of which is accessible by rows and columns and is connected to write and read circuits, the said read and write circuits making it possible to programme them in two states respectively, "1" or "0", depending on the input data, and to read the state programmed, the said memory cells being of the type requiring a programming current in order to be programmed in a first state or "1" and requiring no current to be programmed in a second state or "0", a device comprising a simulation circuit activated by data corresponding to a "0" programming operation and delivering a current identical to that of a memory cell in a "1" programming condition.

Various embodiments can be applied to this simulation circuit. According to a first embodiment, the simulation circuit consists of an additional memory cell connected to a second write circuit parallel to the first write circuit and activated by a datum corresponding to a "0" programming operation. More specifically, the second write circuit consists of a load comprising a depleted MOS transistor which is series-mounted with an enhanced MOS transistor. The gates of both transistors are connected to each other and to an activation circuit that applies the write control voltage $V_{pp}$ for data corresponding to a "0" programming operation. The load is connected between the write control voltage $V_{pp}$ and the additional memory cell, the gate of which is connected directly or by a subtractor to the gates of the two transistors forming a load.

According to another embodiment, the simulation circuit comprises an additional memory cell connected to the write circuit of the memory so as to receive a programming current for data corresponding to a "0"

programming operation. In this case, the write circuit consists of a load comprising a depleted MOS transistor which is series-mounted with an enhanced MOS transistor. The gates of these two transistors are connected to each other and are connected to the write control voltage $V_{pp}$. The load is connected between the write control voltage $V_{pp}$ and the memory cells of the memory zone or the additional memory cell respectively, by AND gates controlled by data corresponding either to a programming at "1" or to a programming at "0".

According to another characteristic of the present invention, the additional memory cell, like the memory cells, comprises floating-gate MOS transistors. However, the additional memory cell is a programmable cell since the same cell is used for a set of memory cells of the memory plane. Now, an already programmed memory cell shows a current consumption curve which is different from that of a blank memory cell: a blank memory cell of a non-volatile memory displays a current consumption peak of about 2% at the start of the programming operation and this peak is practically resorbed after 2 milliseconds. Now, this consumption peak no longer exists in the case where the cell is re-programmed. However, in presently used electrically programmable non-volatile memories, an octet (namely eight parallel binary positions) is always programmed. However, on eight binary positions, the difference in current between a blank cell and a programmed cell in the programming condition is very difficult to detect. Furthermore, the mean current of a blank cell being programmed and that of an already programmed cell is substantially the same since the load curve of the cell is positioned in the snap-back zone. Consequently, the use of a floating-gate MOS transistor for the additional memory cell generally gives good results and prevents any differentiation between programming at "1" and at "0". However, especially in a bit by bit programming operation, it is preferable to use an additional memory cell consisting of a floating-gate MOS transistor which has its floating-gate short-circuited with the control gate and which has the same gate-source voltage as the other memory cells.

DESCRIPTION OF THE DRAWINGS

Other characteristics and advantages of the present invention will emerge from the following description of various embodiments made with reference to the appended drawings, of which:

FIG. 1, already described, gives a schematic view of a memory cell of an EPROM memory connected to its control circuits, FIG. 2 gives a schematic view of an embodiment of a memory cell of an EPROM memory connected to its control circuits comprising a safety device according to the present invention, FIG. 3 gives a schematic view of an alternative embodiment of the safety device according to the invention, and FIG. 4 gives a schematic view of another embodiment of a memory cell of an EPROM memory connected to its control circuits and comprising a safety device according to the present invention.

To simplify the description, the same elements bear the same references in the drawings. Furthermore, the description is made with reference to MOS circuits made with NMOS technology. However, it is clear to the specialist that the present invention can be adapted to other technologies. The memory described is an EPROM memory with its memory cells comprising floating-gate MOS transistors of the SAMOS (stacked gate avalanche injection MOS) type. The present invention can also be applied to MOS transistors of the FAMOS (floating-gate avalanche injection MOS) type.

DESCRIPTION OF THE EMBODIMENTS

Thus, as shown in FIG. 2, a memory cell comprising the floating-gate MOS transistor is connected, in the same way as in the embodiment of FIG. 1, to a row address decoder 6, a column address decoder 7, a read circuit L and a write circuit E. Consequently, these various circuits will not be described again. According to the present invention, the EPROM memory depicted schematically by its memory cell 1, further comprises a safety device which prevents the detection of "1" or "0" programming operations.

As shown in FIG. 2, the safety device essentially comprises a simulation circuit E2, comprising a memory cell 15, consisting of a floating-gate MOS transistor with one of its main electrodes or source 15' connected to the voltage $V_{SS}$, and its other main electrode or drain 15" connected to a load consisting of two MOS transistors 18 and 19. More specifically, the MOS transistor 18 is a depleted transistor while the MOS transistor 19 is an enhanced transistor. These two transistors are series-connected, the drain of the transistor 18 being connected to the write control voltage $V_{pp}$ and the source of the MOS transistor 19 being connected to the drain 15" of the floating-gate MOS transistor 15 forming the additional memory cell. Furthermore, the transistor gates 18 and 19 are connected together and are connected to an activation circuit. Similarly, the control gate 16 of the floating-gate MOS transistor 15 is connected to the connection point of the transistor gates 18 and 19. The activation circuit consists of a NOR gate 14 powered by the write control voltage $V_{pp}$. This NOR gate 14 receives the input signal D, corresponding to the input data, and the signal $\overline{PGM}$ corresponding to the inverted PGM programming signal. As shown in FIG. 2, in a known way, the signals $\overline{D}$ and D, which respectively enter the NOR gates 13 and 14, come from a dynamic register R of a known type. The register R is used to store and refresh data. More specifically it receives, at its input, data to be written in the form of the logic levels "1" or "0". The register R essentially comprises storage means consisting of capacitances, (not shown) placed in front of the two inverters I1 and I2, and a MOS transistor 20 controlled by the signal CLK representing the clock signal of the memory. This MOS transistor 20 is used for data-refreshing. Thus, at the output of the inverter I1, namely at the node N1, the datum $\overline{D}$ is obtained and is sent to the input of the NOR gate 13. Then, at the output of the inverter I2, namely at the node N2, the datum D is obtained and is sent to the input of the NOR gate 14.

We shall now explain the functioning of the circuit according to the present invention. Thus, to programme a memory cell, of the type shown in FIG. 2, at level "1", a programming voltage equal to $V_{pp}$ is applied to its control gate 5, the said memory cell 1 being selected by decoders 6 and 7. In this case, the transistors 8, 11 and 12 correspond to a load resistance. For, since the signal D corresponds to a logic level "1" and since the signal PGM is activated, a logic level "1" is obtained at the output of the NOR gate 13. Consequently the MOS transistors 11 and 12 are on and the drain voltage of the floating-gate MOS transistor 1 is equal to $V_{pp}-V$ load, while the gate voltage $V_{GP}$ is equal to $V_{pp}$. The MOS transistor 1 is programmed and a current consumption is observed at $V_{pp}$. During this time, the output of the NOR gate 14 is at the logic level "0". Consequently, the transistors 18 and 19 are off and, furthermore, the gate of the memory cell 15 is at the logic level "0" and there is no programming at the level of these cells.

By contrast, if it is desired to programme a memory cell, such as the floating-gate MOS transistor 1, at "0", the said memory cell 1 being selected by decoders 6 and 7, its control gate 5 receives a programming voltage equal to $V_{pp}$. In this case, the transistors 11 and 12 are off for they receive a logic level "0" at their gate since $\overline{D}$ is at the logic level "1" while the signal $\overline{PGM}$ is at the logic level "0". Consequently, no current consumption can be observed at $V_{pp}$ following the programming at "0" of the memory cell 1. However, the output of the NOR gate 14 is in this case at the logic level "1" since the signals D and $\overline{PGM}$ are at the logic level "0". Consequently, the transistors 18 and 19 come on, the voltage at the drain 15" of the additional memory cell 15 becomes equal to $V_{pp} - V$ load, and the voltage at the gate 16 is equal to $V_{pp}$. Hence, there is current consumption on $V_{pp}$ since there is simulation of a programming at "1" at the additional memory cell 15.

Consequently, with the above device, it is difficult to detect a programming at "1" or at "0" by measuring the current consumption on the write control voltage $V_{pp}$. However, the simulation of programming at "1" on the additional memory cell corresponds to the programming of an already-programmed memory cell. Now, an already-programmed memory cell has a current consumption curve which is slightly different from that of a blank memory cell. For a blank memory cell of a non-volatile memory, of an EPROM type for example, has a current consumption peak of about 2% at the start of programming, a peak that practically resorbed after 2 milliseconds. However, in EPROM memories, the programming is not done memory cell by memory cell. The programming is generally done on eight parallel memory cells. In fact, with eight parallel memory cells, the difference in current between a blank cell and a programmed cell in the programming condition is very difficult to detect. Furthermore, the mean current of a blank cell being programmed and that of an already programmed cell is substantially the same since the load curve is positioned in the snap-back zone of the cell.

However, to remove this disadvantage, the additional memory 15 may be replaced by the memory cell 15' shown in FIG. 3. In this case, the memory cell 15' comprises a floating-gate MOS transistor which has its floating-gate 17' short-circuited with its control gate 16'. The memory cell 15' is connected in an identical way with the memory cell 15, i.e. its source is connected to $V_{SS}$ while its drain is connected to a load comprising MOS transistors 18 and 19. Similarly, the control gate 16' of the MOS transistor 15' is connected to the common point with the gates of the MOS transistors 18 and 19 at the output of the NOR gate 14. In this case, the gate 16' is connected by a voltage subtractor 21 so as to apply the same gate-source voltage VGS to the memory cell 15' as to a memory cell comprising a floating-gate MOS transistor. Now VGS equals $\gamma V_{GP}$. Consequently, this same gate-source voltage for the cell 15' as for a normal cell is obtained by using the factor $\gamma$. Hence, instead of applying $V_{pp}$ on the unit formed by the control gate 16' and the floating-gate 17' of the additional cell 15', a voltage is applied which is equal to $\gamma V_{pp}$. This voltage can be obtained from the voltage $V_{pp}$ by using the voltage subtractor circuit 21.

In fact, the circuit shown in FIG. 3 works in a way identical to that of the circuit E2 of FIG. 2, the only difference lying in the fact that the curve of the current consumed at $V_{pp}$ is identical to that of the current consumed during the programming at "1" of a normal memory cell 1.

Referring to FIG. 4, we shall now describe another embodiment of a safety device for the programming of an electrically programmable non-volatile memory according to the present invention. In the embodiment of FIG. 4, it is no longer two independent write circuits but one and the same write circuit that is used to write the normal memory cells 1 or the additional memory cell 32. As shown in FIG. 4, the floating-gate transistor 1 is connected to the row address decoder 6, the column address decoder 7 and the read circuit L in the same way as in the embodiment of FIG. 1. In this case, however, the write circuit is connected to the node N not directly but by an AND gate 36 which receives the signal from the NOR gate 13 at one of its inputs and a signal from the write circuit proper at its other input. The write circuit proper consists of a depleted MOS transistor 30 and the enhanced MOS transistor 31 mounted as a load. The drain of the MOS transistor 30 is connected to the write control voltage $V_{pp}$ while the source of the MOS transistor 31 is connected to the input of the AND gate 36 as well as to the input of an AND gate 35 which will be described later. The gates of the transistors 30 and 31 are connected to each other and to the write control voltage $V_{pp}$. Furthermore, the circuit according to the present invention comprises an additional memory cell consisting of a floating-gate MOS transistor 33 which has its source connected to $V_{SS}$ and its drain connected to the output of the AND gate 35. The said AND gate 35 receives an input signal from the write circuit consisting of the transistors 30 and 31. At its other input, it receives the signal from the NOR gate 14. The NOR gates 13 and 14 are identical to the NOR gates described with reference to FIG. 2, and they work in the same way. Furthermore, the control gate 34 of the floating-gate MOS transistor 32 is connected to the output of the NOR gate 14. It is obvious to the specialist that the memory cell 32 may comprise a floating-gate MOS transistor with its floating-gate 33 short-circuited at the gate 34. With the circuit of FIG. 4, when an input datum D is at logic level "1", the output of the NOR gate 13 is at the logic level 1 while the output of the NOR gate 14 is at the logic level "0". The AND gate 36 is on since the node N3 is still at logic level "1" corresponding to the voltage $V_{pp}$. Consequently, the memory cell 1, selected by the column address decoder 7 and the row address decoder 6, is programmed and a current variation is observed at $V_{pp}$. When a datum D at logic level "0" is input, then the output of the NOR gate 13 is at "0", blocking the AND gate 36, and the output of the NOR gate 14 moves to the logic level 1 corresponding to $V_{pp}$, thus unblocking the AND gate 35 and simulating a "1" programming operation at the additional memory cell 32. With this circuit it cannot be ascertained, by current detection, that a logic level "1" or "0" has been programmed at a given address.

The above circuits have been given as examples. It is obvious to the specialist that other embodiments can be used for the simulation circuit and would correspond to the characteristics given in the claims below.

Furthermore, the logic states "1" and "0" have been chosen according to a certain convention and it is obvious to the specialist that a reverse convention could have been chosen. This convention in no way limits the scope of the claims.

What is claimed is:

1. Safety device for the programming of an electrically programmable non-volatile memory wherein said memory comprises:

a matrix of memory cells, each of which is accessible by rows and columns and which is connected to read and write circuits wherein said read and write circuits are for programming, in two states each of the memory cells respectively, a "1" or "0" indicative of a first state and a second state, respectively depending on the input data, and wherein said memory contains means to read the state programmed further wherein each of said memory cells is of the type requiring a programming current in order to be programmed in a first state or "1" and which require no current to be programmed in a second state or "0", wherein said safety device comprises a simulation circuit activated upon reception of input data, corresponding to the second state, for drawing a current identical to the current drawn by a given memory cell upon reception of input data corresponding to said first state.

2. A safety device according to the claim 1 wherein the simulation circuit further comprises:

an additional memory cell connected to a second write circuit parallel to the first write circuit activated by a datum corresponding to a "0" programming operation.

3. A safety device according to the claim 1 wherein the simulation circuit comprises:

an additional memory cell connected to the write circuit of the memory by means 25 used to receive a programming current for data corresponding to a "0" programming operation.

4. A safety device according to the claim 2 wherein the memory cells as well as the additional memory cell are comprised of floating-gate MOS transistors.

5. A safety device according to the claim 3 wherein the memory cells as well as the additional memory cell are comprised of floating-gate MOS transistors.

6. A safety device according to the claim 2 wherein, the memory cells comprise floating-gate MOS transistors, the additional memory cell comprises a floating-gate MOS transistor which has its floating gate short-circuited with the control gate and which displays the same gate-source voltage as the other memory cells.

7. A safety device according to the claim 3 wherein, the memory cells comprises floating-gate MOS transistors, the additional memory cell comprises a floating-gate MOS transistor which has its floating gate short-circuited with the control gate and which displays the same gate-source voltage as the other memory cells.

8. A safety device according to the claim 6 wherein the gate-source voltage of the additional memory cell is obtained by applying, to the control gate of the said cell, a write control voltage equal to $\gamma$, the write control voltage applied to the other memory cells, with $\gamma$ being the coupling factor of a floating-gate transistor.

9. A safety device according to the claim 6 wherein the gate-source voltage of the additional memory cell is obtained by applying, to the control gate of the said cell, a write control voltage equal to $\gamma$, the write control voltage applied to the other memory cells, with $\gamma$ being the coupling factor of a floating-gate transistor.

10. A safety device according to the claim 2 wherein the second write circuit comprises a load which comprises:

a depleted MOS transistor series-mounted with an enhanced MOS transistor, the gates of the two transistors being connected together and to an activation circuit that applies the write voltage $V_{pp}$ for data corresponding to a "0" programming operation, with the load being connected between the write control voltage $V_{pp}$ and the additional memory cell which has its control gate connected to the gates of the two load transistors.

11. A safety device according to the claim 10 wherein the activation circuit comprises a NOR gate which is powered by the write control voltage and which receives an inverted programming control signal ($\overline{PGM}$) and the datum to be programmed D respectively.

12. A safety device according to the claim 3 wherein the write circuit comprises of a load which comprises:

a depleted MOS transistor which is series-mounted with an enhanced MOS transistor, the gates of the two transistors being connected together and to the write control voltage $V_{pp}$, the load being connected between the write control voltage $V_{pp}$ and the memory cells of the memory zone and the additional memory cell respectively, by AND gates opened by signals from the activation circuits which are controlled either by data corresponding to a "1" programming operation or by data corresponding to a "0" programming operation.

13. A safety circuit for the programming of an electrically programmable non-volatile memory wherein said memory comprises:

a matrix of memory cells;

wherein each of said cells is connected to said read/write circuits;

and wherein each of said cells is programmable into two states dependent upon input data and where when programmed into the first state a current is required and where no current is required for the programming of a second state; wherein said safety device comprises:

a simulation circuit which is activated upon reception of input corresponding to the second state and which draws current identical to the amount of current drawn by a memory cell upon reception of input data corresponding to said first state;

an additional memory cell connected in parallel to first write cell and which is activated in response to data corresponding to said second state and which further comprises a load having a depleted MOS transistor which is mounted in series with an enhanced MOS transistor, with the gates of said transistor connected together and an activation circuit for applying a write voltage $V_{pp}$, for data corresponding to said second state with said load being connected between a means for supplying said write voltage $V_{pp}$ and said additional memory cell, whose control gate is connected to the gates of said two load transistors.

* * * * *